United States Patent [19]

Hart

[11] 4,137,465
[45] Jan. 30, 1979

[54] MULTI-STAGE INTEGRATED INJECTION LOGIC CIRCUIT

[75] Inventor: Cornelis M. Hart, Eindhoven, Netherlands

[73] Assignee: U.S. Philips Corporation, New York, N.Y.

[21] Appl. No.: 802,939

[22] Filed: Jun. 2, 1977

[30] Foreign Application Priority Data

Jun. 9, 1976 [NL] Netherlands .................... 7606193

[51] Int. Cl.² .................. H03K 17/04; H03K 17/60; H03K 3/286; H03K 19/08
[52] U.S. Cl. .................................. 307/255; 307/203; 307/213; 307/289; 307/291; 307/299 B; 357/92
[58] Field of Search ............... 307/213, 255, 289, 291, 307/288, 203, 299B; 357/92

[56] References Cited

U.S. PATENT DOCUMENTS

| | | | |
|---|---|---|---|
| 3,909,807 | 9/1975 | Fulton | 357/92 X |
| 3,947,865 | 3/1976 | Russell | 357/92 X |
| 3,989,957 | 11/1976 | Tuccu | 357/92 X |
| 3,993,918 | 11/1976 | Sinclair | 307/279 |
| 4,007,385 | 2/1977 | Chapron | 357/92 X |
| 4,051,389 | 9/1977 | Kaneko et al. | 307/291 |
| 4,056,736 | 11/1977 | Blatt | 307/291 X |
| 4,056,810 | 11/1977 | Hart et al. | 357/92 X |

Primary Examiner—Larry N. Anagnos
Attorney, Agent, or Firm—Thomas A. Briody; James J. Cannon, Jr.

[57] ABSTRACT

A multi-stage I²L circuit includes a first switching transistor in a higher stage coupled as a bistable trigger to a second transistor in a lower stage. Additional circuitry is supplied to increase the switching speed of the I²L circuit by draining stored charge from the base of the second transistor. Regenerative feedback is employed to enhance the effect.

3 Claims, 3 Drawing Figures

MULTI-STAGE INTEGRATED INJECTION LOGIC CIRCUIT

The invention relates to an integrated circuit with transistors whose bases are connected to current injectors and to a collector of one or more other transistors, the circuit being divided into a plurality of elementary groups, which are series-connected in respect of power supply, so that the groups constitute stages which are arranged one above the other, among which stages the supply voltage is divided, while for signal transfer from a first stage to a deeper-situated second stage the collector of a first transistor which supplies the signal drives an auxiliary transistor of an opposite conductivity type, whose collector is connected to the base of a second transistor in the second stages, which base is not connected to a current injector.

Such integrated circuits are known from the literature by the name $I^2L$-circuits. See for example French Patent Application No. 2,138,905 and corresponding U.S. Pat. No. 4,056,810. These are circuits which inter alia comprise a current injector, which generally consist of a plurality of consecutive semiconductor layers (for example three or five layers) of alternate conductivity types, which constitute consecutive rectifying junctions. The first of these junctions is forward biased, so that charge carriers are injected via this junction. In this respect the flow of charge carriers is of particular importance which consists of the type of charge carriers which are a minority in the second layer of the current injector and in the layers of the current injector which have the same conductivity type as second layer.

The current which is thus permanently injected into the structure of such an integrated circuit serves for adjusting the operating point of the transistors included in the said circuit. Subsequently, this operating point can be changed by the application of control signals.

It is known that due to the use of a current injection structure integrated circuits using current injectors operate with very low supply voltages. For a silicon integrated circuit this is for example 0.7 V. This is advantageous when these circuits are employed for making devices of which the power of the supply source and thus the dissipated power are very low. Furthermore, it is known that a very interesting advantage of this technique resides in a substantial reduction of the number of conductor tracks which is necessary for applying the bias currents, which are necessary for adjusting the operating points, to the transistors which are used. This simplifies the fabrication and moreover it yields a substantial reduction of the semiconductor area required for the circuit.

Similar integrated circuits are known from the German Patent Application No. 2,433,171, and copending U.S. patent application Ser. No. 717,194, filed Aug. 24, 1976. The circuits known from these patent applications have the disadvantage that although the second transistor in the second stage is rapidly turned on by the auxiliary transistor, the base charge of the second transistor cannot be drained via a low-ohmic path when the auxiliary transistor is turned off, so that said second transistor is turned off only slowly. As a result of this high switching speeds cannot be realized, at least not for the relevant signal edge.

It is an object of the invention to provide a solution to the aforementioned problem and the invention is characterized in that the base of the second transistor is connected to a collector of a third transistor of the same conductivity type as the second transistor, the base of the third transistor both being connected to a collector of the second transistor and to the collector of a second auxiliary transistor of the opposite conductivity type, which second auxiliary transistor is controlled from the collector of a fourth transistor which is situated in a stage above the second stage and which second auxiliary transistor supplies a signal which is the inverse of the signal supplied by the first auxiliary transistor.

The present invention considerably increases the reliability of the final logic condition. Furthermore, the resulting regenerative action yields an additional increase in speed.

The invention will be described in more detail with reference to the drawing.

FIG. 1 schematically represents the type of $I^2L$ circuit to which the invention belongs.

Figure 1:
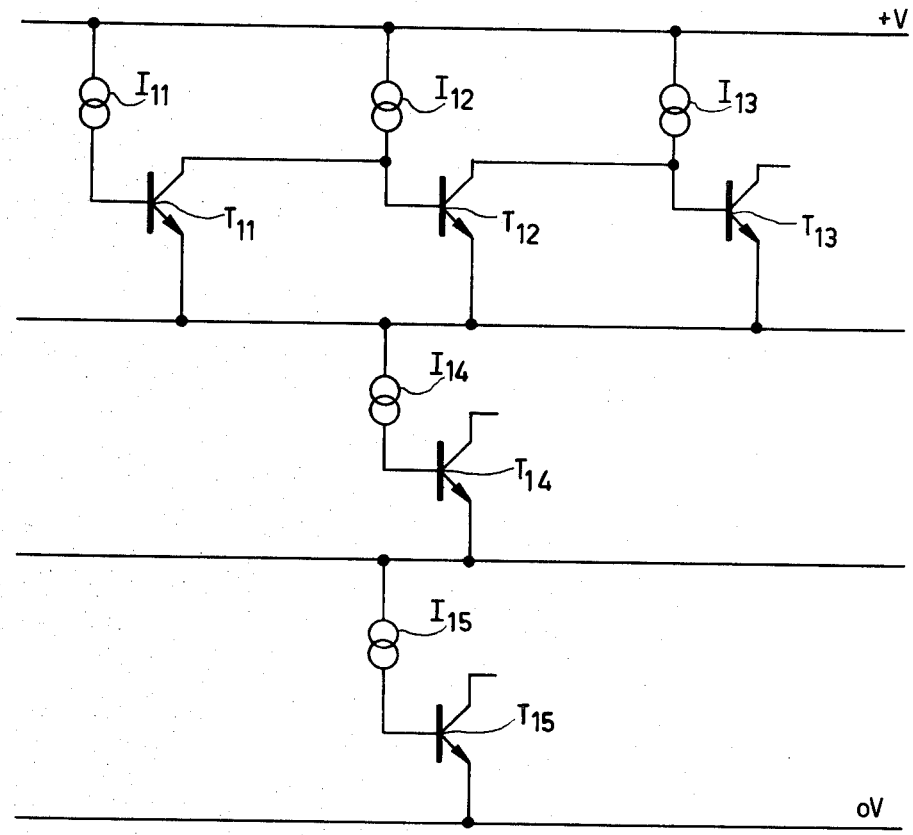

FIG. 1 shows an $I^2L$ circuit comprising three stages, which are connected in series across a supply voltage source, so that a higher supply voltage can be used more effectively, inter alia yielding a reduction in power consumption. In the upper stage, which is connected directly to the positive terminal $+V$ of the supply voltage source, three stages are connected in parallel, which stages are represented by the transistors $T_{11}$, $T_{12}$ and $T_{13}$. Each stage comprises current injectors, which are designated by the current sources $I_{11}$, $I_{12}$ and $I_{13}$. The lower-situated stages which are represented by the transistors $T_{14}$ and $T_{15}$, are connected in series with the upper stage. The bases of the transistors $T_{14}$ and $T_{15}$ are connected to the current injectors $I_{14}$ and $I_{15}$ respectively. If the switching speed of the transistors depends on the magnitude of the injection current, the three transistors in the upper stage will be switched more slowly than the transistors in the stages situated underneath it. However, this need not be a disadvantage and may for example be utilized effectively in dividers in which the first stages should be capable of operating substantially faster than the subsequent stages.

Figure 2:
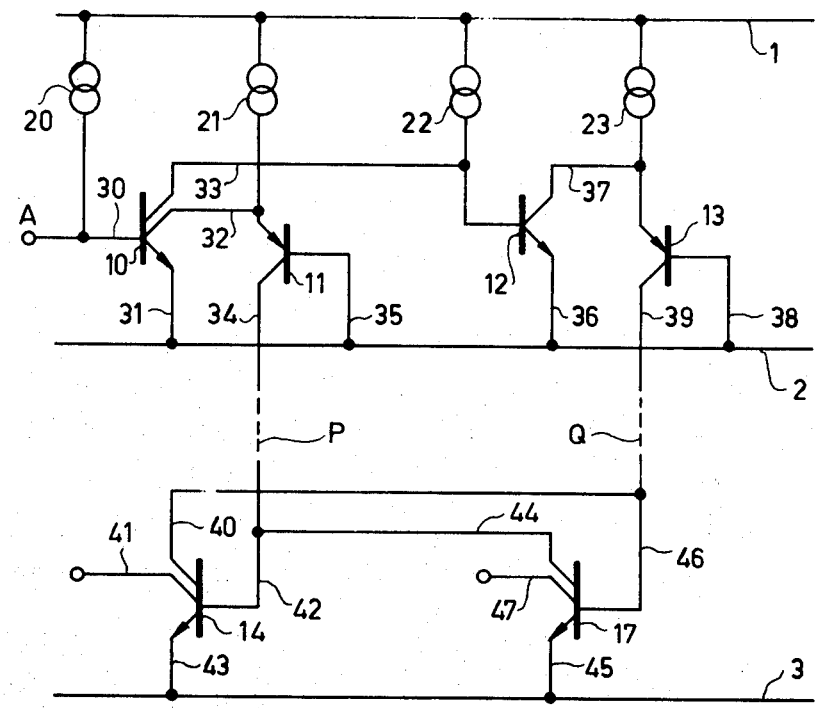
FIG. 2 shows an embodiment of the circuit in accordance with the invention.
Figure 3:
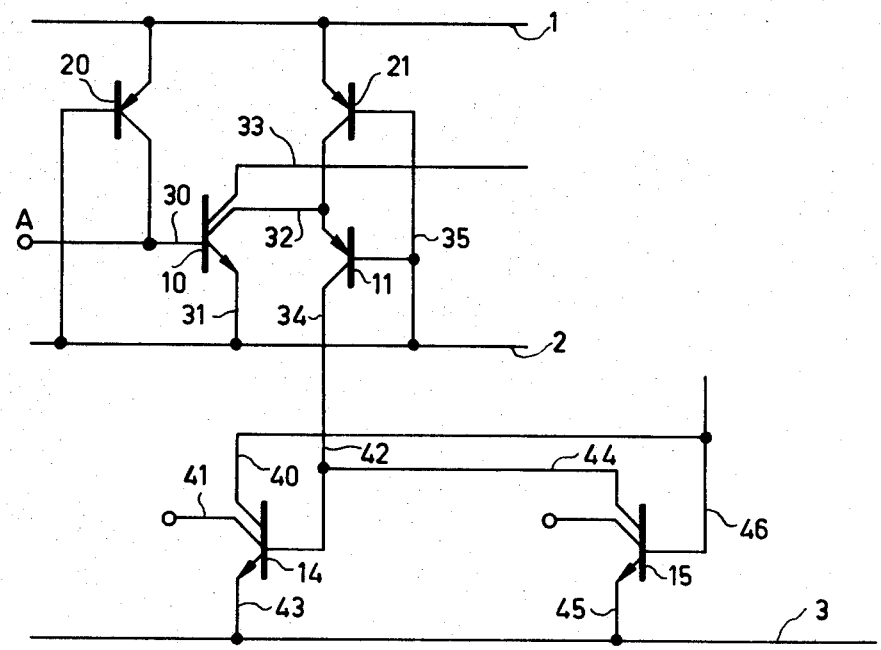
FIG. 3 is a further elaboration of the embodiment of FIG. 2.

The signal transfer from a higher stage to a lower stage, however, presents problems, as will be described with reference to FIG. 2. The circuit of FIG. 2 comprises two stages which are connected in series across a power supply. The first stage comprises the transistors 10, 11, 12 and 13 and the two current injectors 20 and 22. The emitter 31 of transistor 10 and the emitter 36 of the transistor 12 are connected to a supply point 2. The base 30 of the transistor 10 is both connected to a supply point 1 via the current injector 20, and to the input to which the logic signal A is applied. The collector 33 of the transistor 10 is connected to the base of the transistor 12 and also via the current injector 22 to the supply point 1. The collector 32 of the switching transistor 10 is connected to the emitter of the auxiliary transistor 11, whose base 35 is connected to the supply point 2. The emitter of the transistor 11 is also connected to the supply point 1 via the current path 21. The collector 37 of the switching transistor 12 is connected both to the emitter of the auxiliary transistor 13 and via the current source 23 to the supply point 1. The base 38 of the transistor 13 is connected to the supply point 2. As is shown in more detail in FIG. 3, the current injector 20 can be realized with the aid of a PNP-transistor whose collector is connected to the base 30 of the transistor 10, whose base is connected to the emitter of the transistor 10 and whose emitter is connected to the supply point 1. In a similar way the current source 21 can be realized, as is shown in more detail in FIG. 3. The second stage of the circuit of FIG. 2 comprises the switching transistors 14 and 15, whose emitters 43 and 45 are connected to the supply point 3. The collector 40 of the transistor 14 is connected to the base 46 of the transistor 15. The collector 44 of the transistor 15 is connected to the base 42 of the transistor 14.

The collector 34 of the auxiliary transistor 11 is connected to the base 42 of the switching transistor 14 in the lower-situated stage via the conductor P. As is described in the previously mentioned German Patent Application, the base of the transistor 14, in contradistinction to the other transistors in this stage, is not connected to a current injector, because otherwise it is impossible to turn off this transistor 14. When it is assumed that the signal A is high, the transistor 10 will be turned on by the current injector 20 and the current from the current injector 21 will flow through the transistor 10. This means that the auxiliary transistor 11 is in the non-conductive state. Since there is no current in the conductor P the transistor 14 will neither conduct. When it is assumed that the input signal A is low, the transistor 10 will not conduct and the current from the current injector 21 will now flow to the base of the transistor 14 via the auxiliary transistor 11, which transistor 14 is turned on rapidly, so that the signal A will appear at the collector 41 with a slight delay only. It is assumed for the time being that the connections between the collector 40 of the transistor 14 and the base of the transistor 15, and between the collector 44 of the transistor 15 and the base of the transistor 14 are absent. If the signal A now again assumes a high value, the transistor 10 will be turned on rapidly by the current injector 20 and the current from the current source 21 will consequently flow through the transistor 10, so that the current in the conductor P will disappear rapidly. The base charge of the transistor 14, however, can be drained only very slowly, so that the collector current of the transistor 14 also decreases slowly, as a result of which this edge of the signal A will appear at the collector 41 of the transistor 14 after a certain delay. This means that the total transfer time of the lower stage has distinctly deteriorated.

Said transfer time can be improved considerably by the inclusion of additional elements in accordance with the invention. To explain the operation of the complete circuit arrangement of FIG. 2 in more detail, it is assumed that the signal A is high, so that the transistor 10 is turned on by means of the current injector 20. The current from the current injector 21 consequently flows to the collector 32 of the transistor 10, so that the transistor 14 in the lower-situated stage receives no base current via the conductor P. The other collector 33 of the transistor 10 receives the current from the current injector 22, so that the transistor 12 is not conductive and the current from the current injector 23 flows to the transistor 15 via the transistor 13 and the conductor Q, which transistor 15 is then rapidly turned on. As a result of this the base charge of the transistor 14 can be drained rapidly and the transistor 14 is held in the non-conductive state. The said signal edge of the signal A now appears at the collectors 40 and 41 of the transistor with a slight delay only. Rapid turn-off of the transistor 14 is additionally enhanced by the presence of regenerative feedback between the collector 40 of the transistor 14 and the base 46 of the transistor 15. If the signal A subsequently assumes a low value, the transistor 10 is turned off, so that the current injector 22 turns on the transistor 12 and the current from the current injector 23 flows through the transistor 12. Now there will be no current flow through the auxiliary transistor 13 and the conductor Q to the base of the transistor 15, so that the collectors of the transistor 15 will carry no current. When the transistor 10 is turned off, the current from the current injector 21 will again flow via the auxiliary transistor 11 and the conductor P to the base of the transistor 14 and the last-mentioned transistor is rapidly turned on again. The rapid turn-on of the transistor 14 is additionally promoted by the presence of regenerative feedback between the transistors 14 and 15. Thus, the last-mentioned signal edge will also appear at the collectors 40 and 41 with a slight delay. As the transistor 14 is turned on and off equally fast (symmetrical), the overall response time of the complete circuit arrangement of FIG. 2 is substantially reduced. The provision of regenerative feedback between the transistors 14 and 15 has the additional advantage that the reliability of the final logic condition at the collector 41 of the transistor 14 is increased considerably.

I claim:

1. A circuit comprising
    voltage supply terminals;
    a plurality of circuit stages connected in series across said voltage supply terminals so as to include a first in the series connected closer to one supply terminal and defined as a higher stage and at least a second in the series connected further from said one terminal and defined as a lower stage, and current injector means in a plurality of said circuit stages for supplying current thereto;
    said first stage including: a first switching transistor of the first conductivity type having emitter, base, and one or more collectors; a first auxiliary transistor of a second conductivity type having emitter, base, and collector; means connecting a collector of said first switching transistor to the emitter of said first auxiliary transistor, and the base of said first switching transistor to a current injector in said first stage;
    said second stage including a second switching transistor of the first conductivity type having emitter, base, and one or more collectors;
    means connecting the collector of said first auxiliary transistor to the base of said second switching transistor for supplying a signal thereto;
    a third switching transistor of the first conductivity type having emitter, base, and one or more collectors; means connecting a collector of said third switching transistor to the base of said second switching transistor, and the base of said third switching transistor to a collector of said second switching transistor;
    a second auxiliary transistor of the second conductivity type having emitter, base, and collector; means connecting the collector of said second auxiliary transistor to the base of said third switching transistor and supplying thereto a signal which is the inverse of said signal supplied by said first auxiliary transistor to the second switching transistor;
    a fourth switching transistor located in a stage higher than said second stage and having emitter, base and a collector; means connecting the collector of said fourth transistor to said second auxiliary transistor for controlling same, and means connecting the base of said fourth switching transistor to a current injector; and the base of the first switching transistor being connectible to a signal input means and a collector of the second switching transistor being connectible to a signal output means.

2. A circuit as defined in claim 1 wherein the base of said fourth transistor is connected to a collector of said first switching transistor.

3. A circuit comprising
voltage supply terminals;
a plurality of circuit stages connected in series across said voltage supply terminals so as to include a first in the series connected closer to one supply terminal and defined as a higher stage and at least a second in the series connected further from said one terminal and defined as a lower stage, and current injector means in a plurality of said circuit stages for supplying current thereto;
said first stage including: a first switching transistor of the first conductivity type having emitter, base, and one or more collectors; a first auxiliary transistor of a second conductivity type having emitter, base, and collector; means connecting a collector of said first switching transistor to the emitter of said first auxiliary transistor, and the base of said first switching transistor to a current injector in said first stage;
said second stage including a second switching transistor of the first conductivity type having emitter, base, and one or more collectors;
a signal input connected to the base of said first switching transistor;
means connecting the collector of said first auxiliary transistor to the base of said second switching transistor for supplying a signal thereto;
a third switching transistor of the first conductivity type having emitter, base, and one or more collectors; means connecting a collector of said third switching transistor to the base of said second switching transistor; regenerative feedback interconnects the collector of the second and the base of the third switching transistors, and means connected to the base of said third switching transistor for supplying thereto a signal which is the inverse of said signal supplied by said first auxiliary transistor to the second switching transistor; and
a signal output connected to a collector of said second switching transistor.

* * * * *